(12) United States Patent  
Swonger et al.

(10) Patent No.: US 6,507,226 B2  
(45) Date of Patent: Jan. 14, 2003

(54) POWER DEVICE DRIVING CIRCUIT AND ASSOCIATED METHODS

(75) Inventors: James W. Swonger, Palm Bay, FL (US); Brent R. Doyle, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/915,119

(22) Filed: Jul. 25, 2001

(65) Prior Publication Data

US 2002/0014900 A1 Feb. 7, 2002

Related U.S. Application Data

(60) Provisional application No. 60/221,700, filed on Jul. 31, 2000.

(51) Int. Cl.[7] .............................. H03B 1/00; H03K 3/00
(52) U.S. Cl. ...................... 327/108; 327/112; 327/544
(58) Field of Search ............................. 327/333, 108, 327/112, 434, 435, 563, 544; 326/80, 81, 82, 83

(56) References Cited

U.S. PATENT DOCUMENTS

| | | | |
|---|---|---|---|
| 4,532,436 A | * | 7/1985 | Bismarck .................... 327/333 |
| 4,703,199 A | | 10/1987 | Ely ............................. 307/264 |
| 4,942,309 A | * | 7/1990 | Chieli ......................... 327/333 |
| 5,325,258 A | | 6/1994 | Choi et al. ..................... 361/87 |
| 5,539,334 A | | 7/1996 | Clapp, III et al. ............ 326/68 |
| 5,572,156 A | * | 11/1996 | Diazzi et al. ................ 327/109 |
| 6,043,698 A | * | 3/2000 | Hill ............................. 327/333 |
| 6,326,831 B1 | * | 12/2001 | Kumagai ..................... 327/333 |

FOREIGN PATENT DOCUMENTS

| EP | 0 703 666 | 3/1996 | ......... H03K/17/687 |
|---|---|---|---|

* cited by examiner

Primary Examiner—Tuan T. Lam  
(74) Attorney, Agent, or Firm—Allen, Dyer, Doppelt, Milbrath & Gilchrist, P.A.

(57) ABSTRACT

The circuit and method translate a logic level input signal to signals at high voltage levels to drive a power device, such as a power MOSFET, while minimizing the power consumption. The circuit for driving the power device includes a low side gate driver, and a high side gate driver adjacent thereto. The high side gate drive includes a high side gate driver logic input, a high side gate driver output, a latch connected between the high side gate driver logic input and the high side gate driver output, and a control circuit receiving an output of the latch and controlling signals from the high side gate driver logic input to the latch based upon the output of the latch.

26 Claims, 2 Drawing Sheets

POWER DEVICE DRIVING CIRCUIT AND ASSOCIATED METHODS

RELATED APPLICATION

This application is based upon prior filed copending provisional application No. 60/221,700 filed Jul. 31, 2000, the entire disclosure of which is incorporated herein by reference.

FIELD OF THE INVENTION

The present invention relates to integrated circuits, and more particularly, to circuits for driving power devices including voltage level shifters.

BACKGROUND OF THE INVENTION

Power conversion control circuits often use voltage level shifter circuits to translate input logic voltage level signals operating at low voltages (e.g. "low side" at 5 to 12 volts) to output signals at higher voltage levels (e.g. "High side" at 100–112V). For example, automotive, electronic data processing, and industrial control applications require high voltage level shifter circuits to drive various peripheral devices. Such circuits are often implemented in application specific integrated circuits (ASICs) or as independently packaged circuits. Voltage level shifter circuits are usually implemented with logic level devices, fabricated using metal oxide semiconductor field effect transistors (MOSFETS).

Voltage level shifter circuits normally receive an input signal and output an output signal at a different voltage than the input signal. Ideally, voltage level shifter circuits should draw no DC current from the power supplies used to determine the desired output voltages. The output voltages attainable are a function of the power supplies to the shifter circuit and the capabilities of the devices used to build the circuit.

As mentioned, voltage level shifter circuits translate a logic level input signal to signals at high voltage levels. This is a common need in half and full bridge drivers. Conventional approaches send a continuous or pulsed current signal to one high side node to signal a logic "0" state, or a continuous or pulsed current signal to a second high side node to signal a logic "1" state. When the current signal flows, it flows from the high side voltages to the low side voltages, which can be many hundreds of volts differential, limited only by the breakdown voltage of the transmitting/receiving devices. Accordingly, when this current flows across these large voltages, relatively high power dissipation occurs.

SUMMARY OF THE INVENTION

In view of the foregoing background, it is therefore an object of the invention to provide a circuit and method for translating a logic level input signal to signals at high voltage levels to drive a power device, such as a power MOSFET, while minimizing the power consumption.

This and other objects, features and advantages in accordance with the present invention are provided by a high side gate driver. The high side gate drive includes a high side gate driver logic input, a high side gate driver output, a latch connected between the high side gate driver logic input and the high side gate driver output, and a control circuit receiving an output of the latch and controlling signals from the high side gate driver logic input to the latch based upon the output of the latch.

Preferably, the high side gate driver further comprises first and second level shifting signal paths connecting the high side gate driver logic input and the latch. A first switch is in the first level shifting path between the high side gate driver logic input and the latch controlled by the output of the latch, and a second switch is in the second level shifting path between the high side gate driver logic input and the latch controlled by an inverted output of the latch. The first and second switches may comprise P-channel pass transistors. Also, the high side gate driver may include a high side floating voltage supply, and respective loads, such as resistors, connecting the first and second level shifting signal paths to the high side floating voltage supply.

The high side gate driver may also comprise a first current source in the first level shifting path controlled by the high side gate driver logic input, and a second current source, out of phase with the first current source, in the second level shifting path controlled by the high side gate driver logic input. As such, the first and second current sources may comprise respective out of phase NMOS pass transistors controlled by the high side gate driver logic input and connected to a reference voltage supply. Additionally, the latch may be an active low SR latch.

Objects, features and advantages in accordance with the present invention are also provided by a method for driving the power device including latching a high side gate driver logic input signal with a latch, outputting a high side gate driver output signal based upon the latched high side gate driver logic input signal, and controlling the high side gate driver logic input signal based upon the high side gate driver output signal to minimize power consumption. Controlling the high side gate driver logic input signal preferably comprises controlling first and second level shifting signal paths connecting a high side gate driver logic input and the latch. Again, switches, such as P-channel pass transistors, in the level shifting paths between the high side gate driver logic input and the latch are controlled by an output of the latch.

Controlling the first and second level shifting signal paths may further include connecting respective loads, such as resistors, between the first and second level shifting signal paths and a high side floating voltage supply, and providing current sources, such as respective out of phase NMOS pass transistors, in the level shifting paths controlled by the high side gate driver logic input.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
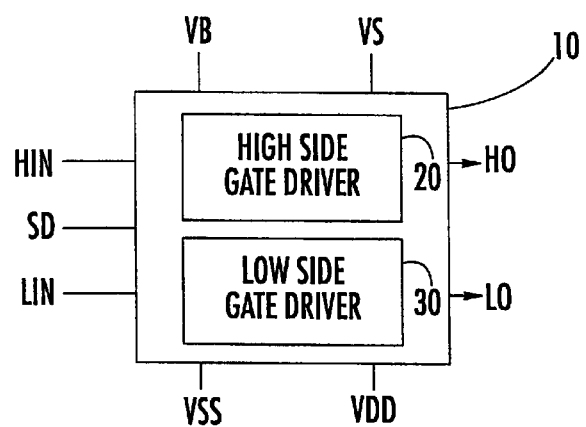
FIG. 1 is a schematic block diagram of a circuit for driving a power device according to the present invention.

Referring to FIG. 1, a circuit 10 for driving a power device, such as a power MOSFET, will now be described.

The circuit 10 is preferably a half or full bridge driver and includes a high side gate driver 20 and a low side gate driver 30 which are independently controlled. The circuit 10 has various voltage supplies and logic inputs/outputs. These include logic supply VDD, logic ground VSS, high side floating supply VB, high side floating supply return VS, high side gate driver logic input HIN, shutdown logic input SD, low side gate driver logic input LIN, high side gate driver output HO and low side gate driver output LO.

Figure 2:
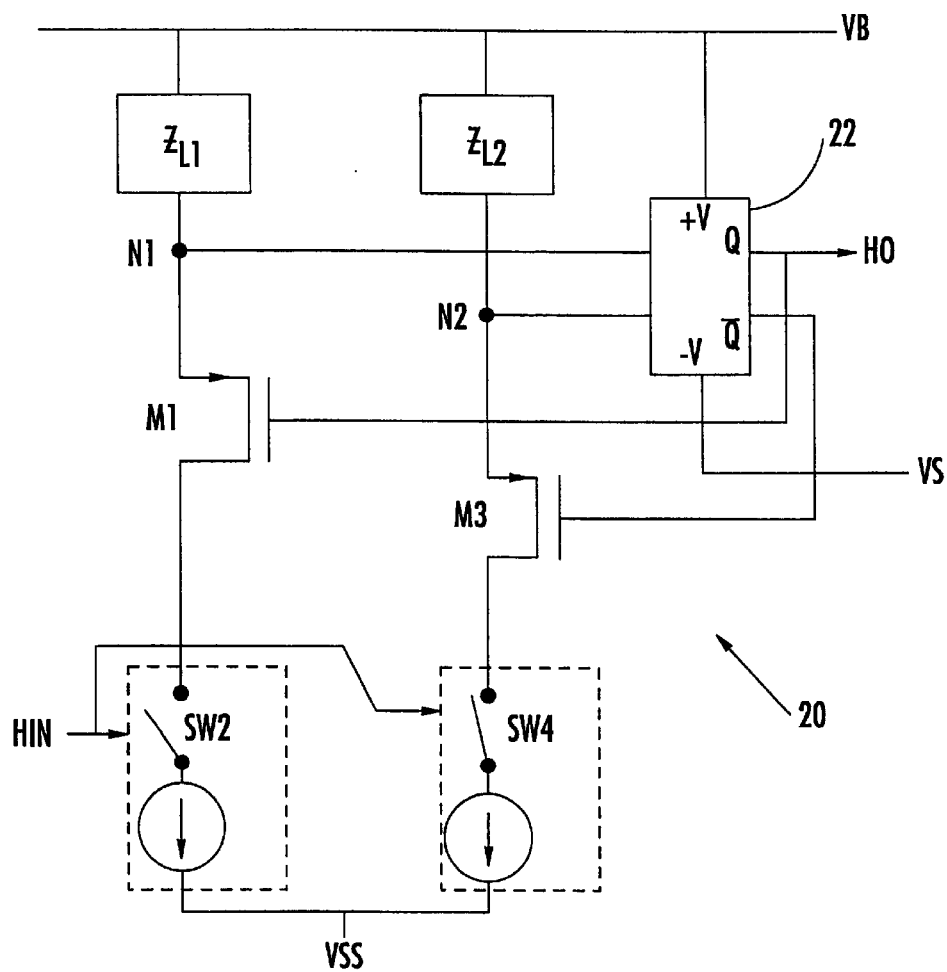
FIG. 2 is a schematic diagram of the high side gate driver of the circuit for driving the power device of FIG. 1.

The high side gate driver 20 will now be described with reference to FIGS. 2 and 3. A general embodiment of the high side gate driver 20 includes a latch 22 which latches and outputs the high side gate drive output signal HO. A first level shifting current path includes a current source SW2, transistor M1, node N1 and load ZL1 connected to the high side floating supply VB. A second level shifting current path includes a current source SW4, transistor M3, node N2 and load ZL2 connected to the high side floating supply VB. The latch 22 receives signals from nodes N1 and N2 in the respective current level shifting paths. The current sources SW2 and SW4 are out of phase with each other (i.e. one on, the other off) and are controlled by the high side gate driver logic input HIN. Transistors M1 and M3 are preferably P-channel pass transistors in the level shifting current paths which are controlled by fedback outputs of the latch 22.

Figure 3:
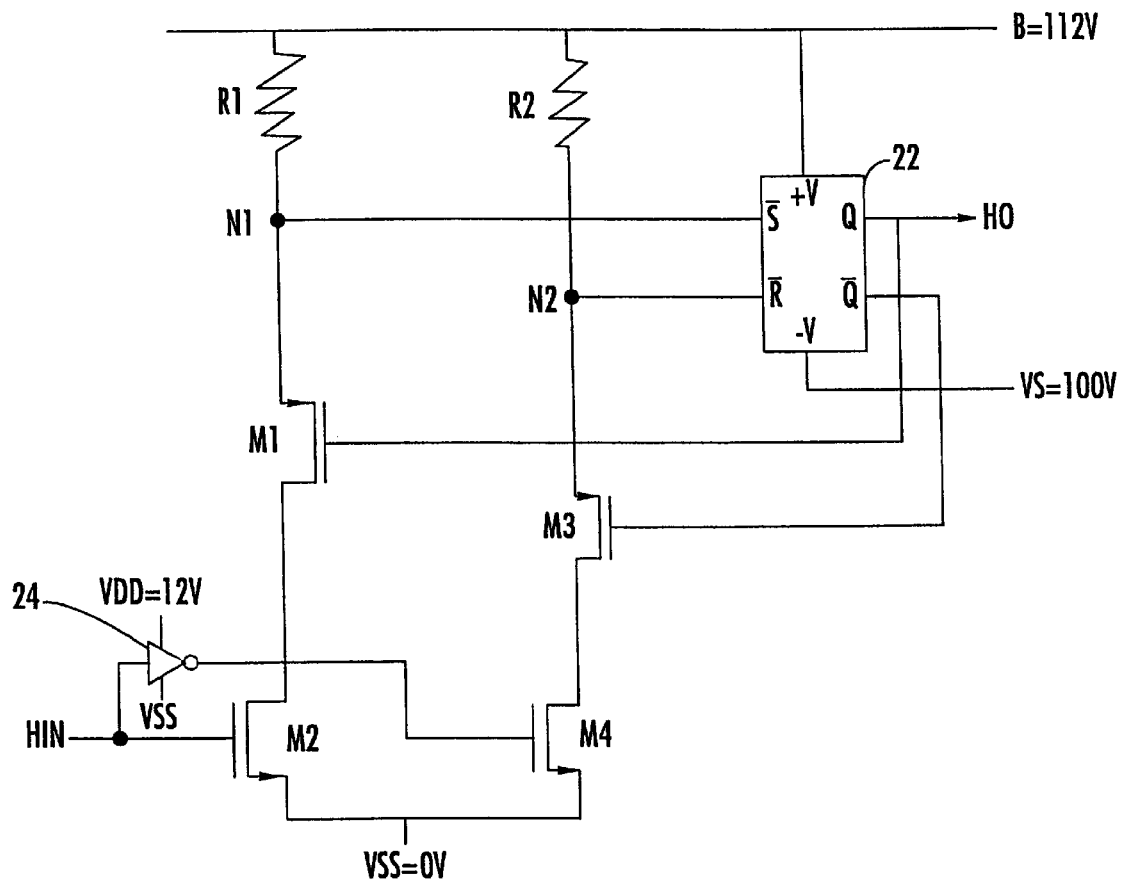
FIG. 3 is a more detailed schematic diagram illustrating an embodiment of the high side gate driver of FIG. 2.

In the example illustrated in FIG. 3, the out of phase current sources SW2 and SW4 are implemented by out of phase NMOS pass transistors M2 and M4 connected to logic ground VSS (0 volts). These transistors M2 and M4 are controlled out of phase by the high side gate driver logic input HIN and the inverter 24. The loads ZL1 and ZL2 are implemented by resistors R1 and R2 and the latch is an active low SR latch. The logic supply VDD is 12 volts, the high side floating supply VB is 112 volts, and the high side floating supply return VS is 100 volts, for example.

In operation, if the high side gate driver logic input HIN equals "0", then transistor M2 is off and transistor M4 is on. If the high side gate drive output HO equals "1" (i.e. the wrong state as HO=HIN=0 is desired), then the transistor M1 is off and transistor M3 is on (as M3 is controlled by Q\=0). With both transistors M3 and M4 on, they conduct and a voltage drop is seen across resistor R2. The transistor and resistor sizes are selected so that this voltage drop appears as a logic "0" at the R\ input of the latch 22 which then resets the latch and outputs Q=0 and Q\=1.

With Q\ now equal to "1", transistor M3 shuts off and stops the current flowing in the second level shifting current path M4-M3-N2-R2. It should be noted that with Q now equal to "0", the transistor M1 turns on but transistor M2 is still off and thus no current flows in the first level shifting current path M2-M1-N1-R1. As soon as the high side latch 22 is switched to the correct state (e.g. HO=HIN=0) the conducting current path is shut off.

Similarly, if the high side gate driver logic input HIN is switched to "1", transistor M2 turns on, transistor M4 turns off and the first level shifting current path M2-M1-N1-R1 is conductive until the voltage drop across resistor R1 sets the latch at Q=1, and Q\=0. Then transistor M1 shuts off the high to low side current flow. Transistor M3 turns on when transistor M1 turns off but no current flows in the second level shifting current path M4-M3-N2-R2 because transistor M4 is off. Again, the high to low side current flow is only maintained until the latch reaches the correct state, then current flow is shut off.

The loads ZL1 and ZL2 could be implemented with other devices such as gain controlled current mirrors, for example. Of course current sources SW2 and SW4 could also be implemented in many different ways as would be appreciated by the skilled artisan. Almost any type of latch 22 could be used provided the feedback connections are properly routed to shut off current flow when the latch reaches the correct state.

The switching of large voltages can couple large currents into junction and stray capacitances, resulting in false level shifting current signals. As such, noise cancellation circuitry would also be appropriate. Also, parallel redundant level shifting current paths could be used to obtain immunity from single event upset (SEU)

Conventional approaches send a continuous or pulsed current signal to one high side node to signal a logic "0" state, or a continuous or pulsed current signal to a second high side node to signal a logic "1" state. The invention sends a pulsed signal to one or the other of the two high side nodes but can sense when the signal has been recognized by the high side logic, and then shuts off the current pulse. This minimizes the power used. When the current signal flows, it flows from the high side voltages to the low side voltages, which can be many hundreds of volts differential, limited only by the breakdown voltage of the transmitting/receiving devices. Accordingly, when this current flows across these large voltages, relatively high power dissipation occurs. The invention minimizes this power by shutting off the current flow as soon as the signal has been recognized by the high side logic.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A circuit for driving a power device comprising:
    a low side gate driver; and
    a high side gate driver adjacent the low side gate driver and comprising
        a high side gate driver logic input,
        a high side gate driver output,
        a latch connected between the high side gate driver logic input and the high side gate driver output, and
        a control circuit receiving an output of the latch and controlling signals from the high side gate driver logic input to the latch based upon the output of the latch.

2. A circuit according to claim 1 wherein the high side gate driver further comprises first and second level shifting signal paths connecting the high side gate driver logic input and inputs of the latch.

3. A circuit according to claim 2 wherein the control circuit comprises:
    a first switch in the first level shifting path between the high side gate driver logic input and a first input of the latch controlled by the output of the latch; and
    a second switch in the second level shifting path between the high side gate driver logic input and a second input of the latch controlled by an inverted output of the latch.

4. A circuit according to claim 3 wherein the first and second switches comprise P-channel pass transistors.

5. A circuit according to claim 2 wherein the high side gate driver further comprises:

a high side floating voltage supply; and respective loads connecting the first and second level shifting signal paths to the high side floating voltage supply.

6. A circuit according to claim 5 wherein the respective loads comprise:

a first resistor connecting the first level shifting signal path to the high side floating voltage supply; and a second resistor connecting the second level shifting signal path to the high side floating voltage supply.

7. A circuit according to claim 2 wherein the high side gate driver further comprises:

a first current source in the first level shifting path controlled by the high side gate driver logic input; and a second current source, out of phase with the first current source, in the second level shifting path controlled by the high side gate driver logic input.

8. A circuit according to claim 7 wherein the first and second current sources comprise respective out of phase NMOS pass transistors controlled by the high side gate driver logic input and connected to a reference voltage supply.

9. A circuit according to claim 1 wherein the latch comprises an active low SR latch.

10. A high side gate driver for a power device driving circuit, the high side gate driver comprising:

a latch for receiving a high side gate driver logic input signal and outputting a high side gate driver output signal; and a control circuit for receiving the high side gate driver output signal of the latch and for controlling signals to the latch based upon the high side gate driver output signal.

11. A high side gate driver according to claim 10 further comprising first and second level shifting signal paths for conducting the high side gate driver logic input signal to inputs of the latch.

12. A high side gate driver according to claim 11 wherein the control circuit comprises:

a first switch in the first level shifting path controlled by the high side gate driver output signal; and a second switch in the second level shifting path controlled by an inverted high side gate driver output signal.

13. A high side gate driver according to claim 12 wherein the first and second switches comprise P-channel pass transistors.

14. A high side gate driver according to claim 11 further comprising respective loads connecting the first and second level shifting signal paths to a high side floating supply voltage.

15. A high side gate driver according to claim 14 wherein the respective loads comprise:

a first resistor connecting the first level shifting signal path to the high side floating supply voltage; and a second resistor connecting the second level shifting signal path to the high side floating supply voltage.

16. A high side gate driver according to claim 11 further comprising:

a first current source in the first level shifting path controlled by the high side gate driver logic input signal; and a second current source, out of phase with the first current source, in the second level shifting path controlled by the high side gate driver logic input signal.

17. A high side gate driver according to claim 16 wherein the first and second current sources comprise respective out of phase NMOS pass transistors controlled by the high side gate driver logic input signal and connected to a reference supply voltage.

18. A high side gate driver according to claim 10 wherein the latch comprises an active low SR latch.

19. A method for driving a power device comprising:

latching a high side gate driver logic input signal with a latch;

outputting a high side gate driver output signal based upon the latched high side gate driver logic input signal; and controlling the high side gate driver logic input signal based upon the high side gate driver output signal to minimize power consumption.

20. A method according to claim 19 wherein controlling the high side gate driver logic input signal comprises controlling first and second level shifting signal paths which connect a high side gate driver logic input and inputs of the latch.

21. A method according to claim 20 wherein controlling first and second level shifting signal paths comprises:

providing a first switch in the first level. shifting path between the high side gate driver logic input and a first input of the latch controlled by an output of the latch; and providing a second switch in the second level shifting path between the high side gate driver logic input and a second input of the latch controlled by an inverted output of the latch.

22. A method according to claim 21 wherein the first and second switches comprise P-channel pass transistors.

23. A method according to claim 20 wherein controlling first and second level shifting signal paths further comprises connecting respective loads between the first and second level shifting signal paths and a high side floating voltage supply.

24. A method according to claim 23 wherein the respective loads comprise:

a first resistor connecting the first level shifting signal path to the high side floating voltage supply; and a second resistor connecting the second level shifting signal path to the high side floating voltage supply.

25. A method according to claim 20 wherein controlling first and second level shifting signal paths further comprises:

providing a first current source in the first level shifting path controlled by the high side gate driver logic input; and providing a second current source, out of phase with the first current source, in the second level shifting path controlled by the high side gate driver logic input.

26. A method according to claim 25 wherein the first and second current sources comprise respective out of phase NMOS pass transistors controlled by the high side gate driver logic input and connected to a reference voltage supply.

* * * * *